US011043622B2

(12) United States Patent
Bonart (10) Patent No.: US 11,043,622 B2
(45) Date of Patent: Jun. 22, 2021

(54) ENCODED DRIVER CHIP FOR LIGHT EMITTING PIXEL ARRAY (71) Applicant: Infineon Technologies AG, Neubiberg (DE)

(72) Inventor: Dietrich Bonart, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 119 days.

(21) Appl. No.: 16/552,893

(22) Filed: Aug. 27, 2019

(65) Prior Publication Data

US 2021/0066558 A1 Mar. 4, 2021

(51) Int. Cl.
*H01L 33/62* (2010.01)
*H01L 25/16* (2006.01)
*G09G 3/32* (2016.01)

(52) U.S. Cl.
CPC ............... *H01L 33/62* (2013.01); *G09G 3/32* (2013.01); *H01L 25/167* (2013.01)

(58) Field of Classification Search
CPC combination set(s) only.
See application file for complete search history.

(56) References Cited

U.S. PATENT DOCUMENTS

| 6,415,977 | B1* | 7/2002 | Rumsey | H01L 23/544 |
| | | | | 235/454 |
| 2003/0174480 | A1* | 9/2003 | Matsuhira | H01L 23/4985 |
| | | | | 361/764 |
| 2005/0082667 | A1* | 4/2005 | Gibson | H01L 22/32 |
| | | | | 257/734 |
| 2017/0162613 | A1* | 6/2017 | Kami | H01L 27/1469 |

FOREIGN PATENT DOCUMENTS

WO 2018231344 A1 12/2018

\* cited by examiner

*Primary Examiner* — Nduka E Ojeh
(74) *Attorney, Agent, or Firm* — Murphy, Bilak & Homilier, PLLC (57) ABSTRACT

A semiconductor chip includes: a semiconductor substrate having driver circuitry configured to drive an array of electronic devices; a metal layer above the semiconductor substrate, the metal layer having an array of contacts electrically connected to the driver circuitry and configured to provide an electrical connection between the semiconductor chip and the array of electronic devices; and a plurality of structures formed in the metal layer and/or in a layer between the metal layer and the semiconductor substrate, the plurality of structures being visually unobstructed at a side of the metal layer which faces away from the semiconductor substrate. Each structure of the plurality of structures is physically encoded with a pattern that corresponds to a location of an individual pair of contacts within the array of contacts or a location of a group of adjacent pairs of contacts within the array of contacts.

20 Claims, 11 Drawing Sheets

ENCODED DRIVER CHIP FOR LIGHT EMITTING PIXEL ARRAY

BACKGROUND

Pixelated light engines for automotive and other applications typically include an LED (light emitting diode) pixel matrix assembled on top of a driver chip (die). In case of a single pixel failure, it is difficult to safely and quickly identify the defective pixel in physical analysis. This can lead to erroneous conclusions if the wrong pixel is selected by physical analysis. One approach used in physical analysis for orientation within the array is to manually add laser marks on the finished product. However, this approach is manual and still susceptible to errors.

Thus, there is a need for a technique for safely and quickly identifying defective pixels of a pixelated light engine.

SUMMARY

According to an embodiment of a semiconductor chip, the semiconductor chip comprises: a semiconductor substrate comprising driver circuitry configured to drive an array of electronic devices; a metal layer above the semiconductor substrate, the metal layer comprising an array of contacts electrically connected to the driver circuitry and configured to provide an electrical connection between the semiconductor chip and the array of electronic devices; and a plurality of structures formed in the metal layer and/or in a layer between the metal layer and the semiconductor substrate, the plurality of structures being visually unobstructed at a side of the metal layer which faces away from the semiconductor substrate, wherein each structure of the plurality of structures is physically encoded with a pattern that corresponds to a location of an individual pair of contacts within the array of contacts or a location of a group of adjacent pairs of contacts within the array of contacts.

According to an embodiment of a method of producing a semiconductor chip, the method comprises: forming, in a semiconductor substrate, driver circuitry configured to drive an array of electronic devices; forming a metal layer above the semiconductor substrate, the metal layer comprising an array of contacts electrically connected to the driver circuitry and configured to provide an electrical connection between the semiconductor chip and the array of electronic devices; forming a plurality of structures in the metal layer and/or in a layer between the metal layer and the semiconductor substrate, the plurality of structures being visually unobstructed at a side of the metal layer which faces away from the semiconductor substrate; and physically encoding each structure of the plurality of structures with a pattern that corresponds to a location of an individual pair of contacts within the array of contacts or a location of a group of adjacent pairs of contacts within the array of contacts.

According to an embodiment of a pixelated light engine, the pixelated light engine comprises: a driver chip; and an array of light emitting pixels on the driver chip. The drive chip comprises: a semiconductor substrate comprising driver circuitry configured to drive the array of light emitting pixels; a metal layer above the semiconductor substrate, the metal layer comprising an array of contacts electrically connected to the driver circuitry and which provides an electrical connection between the semiconductor chip and the array of light emitting pixels; and a plurality of structures formed in the metal layer and/or in a layer between the metal layer and the semiconductor substrate, the plurality of structures being visually unobstructed at a side of the metal layer which faces away from the semiconductor substrate, wherein each structure of the plurality of structures is physically encoded with a pattern that corresponds to a location of an individual pair of contacts within the array of contacts or a location of a group of adjacent pairs of contacts within the array of contacts.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a technique for safely and quickly identifying defective electronic devices in an array of electronic devices. For example, defective pixels of a pixelated light engine may be safely and quickly identified. The pixels may be light emitting or light sensing pixels. In another example, defective memory cells of a memory array may be safely and quickly identified. The technique described herein may be applied to still other types of arrays of electronic devices. In each case, the driver chip (die) included in the electronic system includes structures formed in the uppermost metal layer of the chip and/or in an underlying layer. The structures are visually unobstructed at the top side of the uppermost metal layer and physically encoded with patterns that allow for safe and quick identification of individual electronic devices or groups of electronic devices within an array of the electronic devices included in the electronic system. Described next are various embodiments of forming the location identification structures within the driver chip.

Figure 1A:
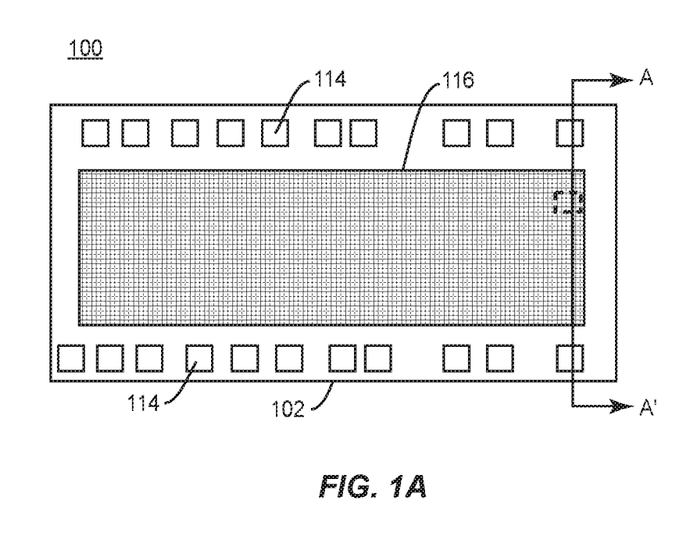
FIG. 1A illustrates a plan view of an embodiment of an electronic system having a driver chip with physically encoded and visually unobstructed structures and an array of electronic devices on the driver chip.
Figure 1B:
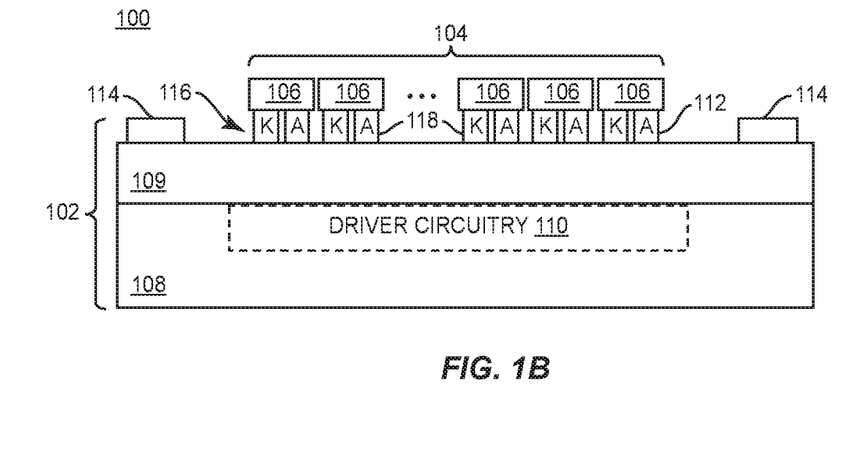
FIG. 1B illustrates a cross-sectional view of the electronic system taken across the line labelled A-A' in FIG. 1A.
Figure 1C:
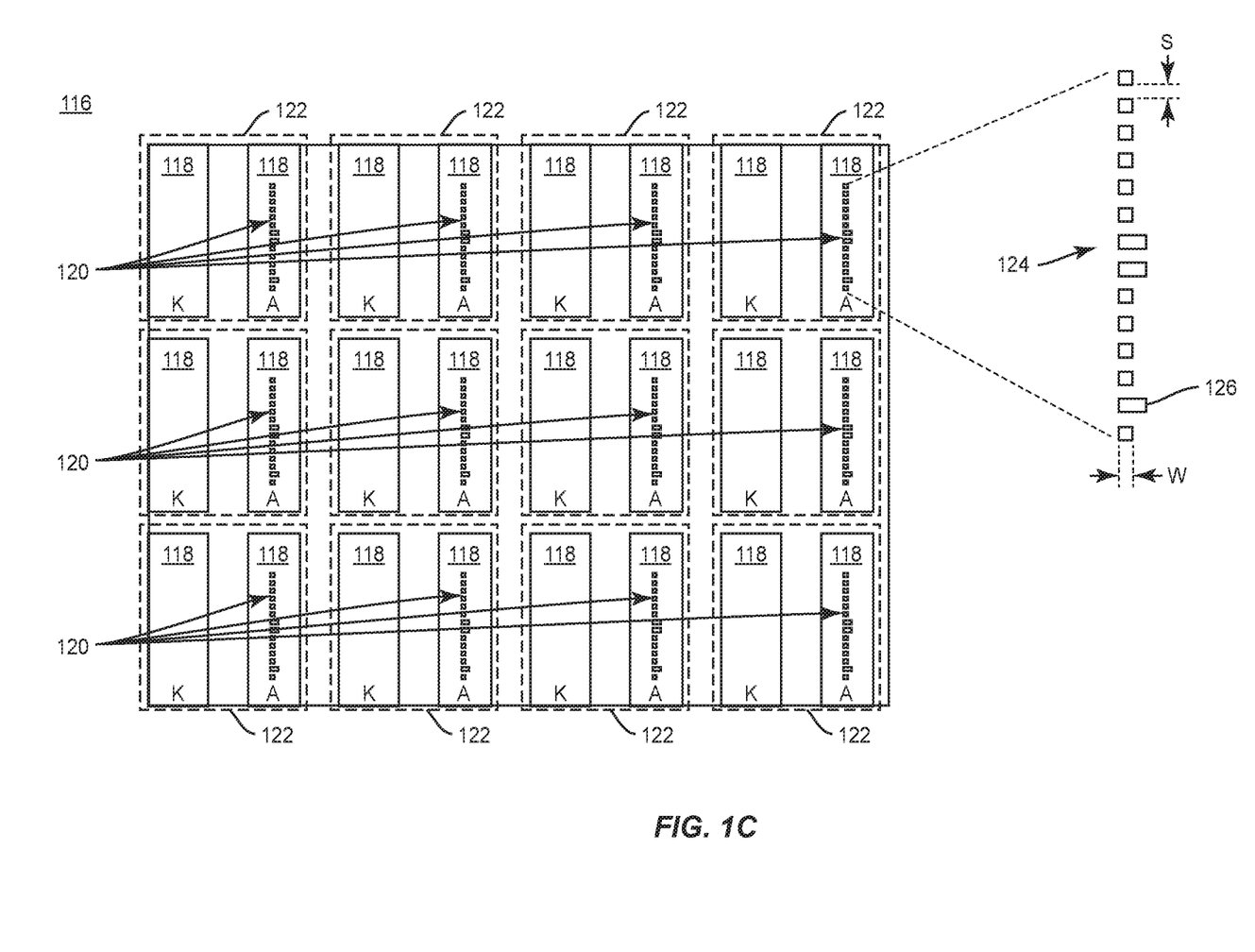
FIG. 1C illustrates an enlarged view of the region included in the dashed box in FIG. 1A.

FIG. 1A illustrates a plan view of an embodiment of an electronic system 100, specifically a pixelated light engine 100. FIG. 1B illustrates a cross-sectional view of the pixelated light engine 100 taken across the line labelled A-A' in FIG. 1A. FIG. 1C illustrates an enlarged view of the region included in the dashed box in FIG. 1A.

The pixelated light engine 100 includes a driver chip 102 and an array 104 of light emitting or light detecting pixels 106 on the driver chip 102. As explained above, the array 104 included in the electronic system 100 may include any type of electronic devices such as light emitting or light detecting pixels 106, memory cells, etc. For ease of explanation, the following description pertains to a pixelated light engine. Hence, the description of the driver chip 102 is specific to light emitting or light detecting pixels but instead could be a driver for other types of electronic device arrays such as an array of memory cells, etc.

With this understanding, the driver chip 102 provides electrical signals which actuate the array 106 of light emitting or light detecting pixels 106, thereby controlling operation of individual ones and/or groups of the light emitting or light detecting pixels 106. The driver chip 102 is a semiconductor die that includes a semiconductor substrate 108 having driver circuitry 110 configured to drive the array 104 of light emitting pixels 106 and one or more metal layers 112 separated from the semiconductor substrate 108 by an insulating material 109 such as silicon nitride, silicon oxide, etc. The array 104 of light emitting or light detecting pixels 106 is not shown in FIGS. 1A and 1C so as to provide an unobstructed top view of the driver chip 102.

In one embodiment, the driver circuitry 110 is a configurable multichannel low-side current source LED (light emitting diode) driver which can control up to 16 k or more light emitting pixels 106. For example, the driver circuitry 110 may include integrated PWM (pulse width modulation) generation for each individual light emitting pixel 106. The driver circuitry 110 may also include a video interface for duty-cycle data streaming, a control and diagnosis interface, built-in self-test circuitry, and other features. In one embodiment, the driver chip 102 is Silicon (Si)-based and the light emitting pixels 106 are Gallium Nitride (GaN) pixels. That is, the substrate 108 of the driver chip 102 is made of Si and the array 104 of light emitting pixels 106 on the drive chip 102 is formed from individual GaN-based pixels 106. Other types of semiconductor materials may be used for the driver chip 102 and the array 104 of light emitting pixels 106. In one embodiment, the array 104 of light emitting pixels 106 is an array of light-emitting diodes formed as physically separate pixels individually attached or connected to the driver chip 102.

The driver chip 102 includes a last (uppermost or top) metal layer 112 formed above the semiconductor substrate 108 and contact pads 114 for providing I/O (input/out) and power connections to the driver chip 102. The last metal layer 112 of the driver chip 102 is patterned/structured to include an array 116 of contacts 118. The array 116 of contacts 118 is electrically connected to the driver circuitry 110 and provides an electrical connection between the driver chip 102 and the array 104 of light emitting or light detecting pixels 106. In other words, the array 116 of contacts 118 formed in the last metal layer 112 of the driver chip 102 provides a point of external electrical connection between the array 104 of light emitting or light detecting pixels 106 and the driver chip 102. In the case of physically separate LED pixels forming the array 104 of light emitting or light detecting pixels 106, each individual pair of contacts 118 formed in the last metal layer 112 of the driver chip 102 includes an anode contact (A) and a cathode contact (K) for connecting to a corresponding LED pixel in the array 104 of pixels 106.

In each case, structures 120 are formed in the last metal layer 112 of the driver chip 102 and/or in a layer between the last metal layer 112 and the semiconductor substrate 108 of the driver chip 102. The structures 120 are visually unobstructed at the (top) side of the last metal layer 112 which faces away from the semiconductor substrate 108 of the driver chip 102 and faces the array 104 of light emitting or light detecting pixels 106. Each structure 120 is physically encoded with a pattern that corresponds to a location of an individual pair 122 of contacts 118 within the array 116 of contacts 118 or a location of a group of adjacent pairs 122 of contacts 118 within the array 116 of contacts 118. The physically encoded and visually unobstructed structures 120 provide for safe and quick identification, by optical inspection, of an individual pixel 106 or a group of adjacent pixels 106 within the array 104 of light emitting or light detecting pixels 106.

FIG. 1C illustrates an embodiment in which each physically encoded and visually unobstructed structure 120 is a group 124 of metal vias 126. Each via 126 of a group 124 of metal vias 1126 is dimensioned so that the group 124 of metal vias 126 is physically encoded with a pattern that corresponds to a location of an individual pair 122 of contacts 118 within the array 116 of contacts 118. Each group 124 of metal vias 126 may be electrically isolated from the array 116 of contacts 118 and from the driver circuitry 110 of the driver chip 102.

According to the embodiment illustrated in FIG. 1C, each via 126 of a group 124 of metal vias 126 is dimensioned so that the group 124 of metal vias 126 is physically encoded with a barcode pattern. The widths (W and spacings (S) of each barcode pattern correspond to a location of an individual pair 122 of contacts 118 within the array 116 of contacts 118 or a location of a group of adjacent pairs 122 of contacts 118 within the array 116 of contacts 118. In the embodiment of FIG. 1C, each barcode pattern identifies the location of an individual pair (anode and cathode) 122 of contacts 118 within the array 116 of contacts 118. Accordingly, the embodiment in FIG. 1C provides 1:1 location mapping for the pixels 106 included in the array 104 of light emitting or light detecting pixels 106. This way, the pixels 106 can be individually located by optical inspection using the encoding embodiment illustrated in FIG. 1C.

Figure 2:
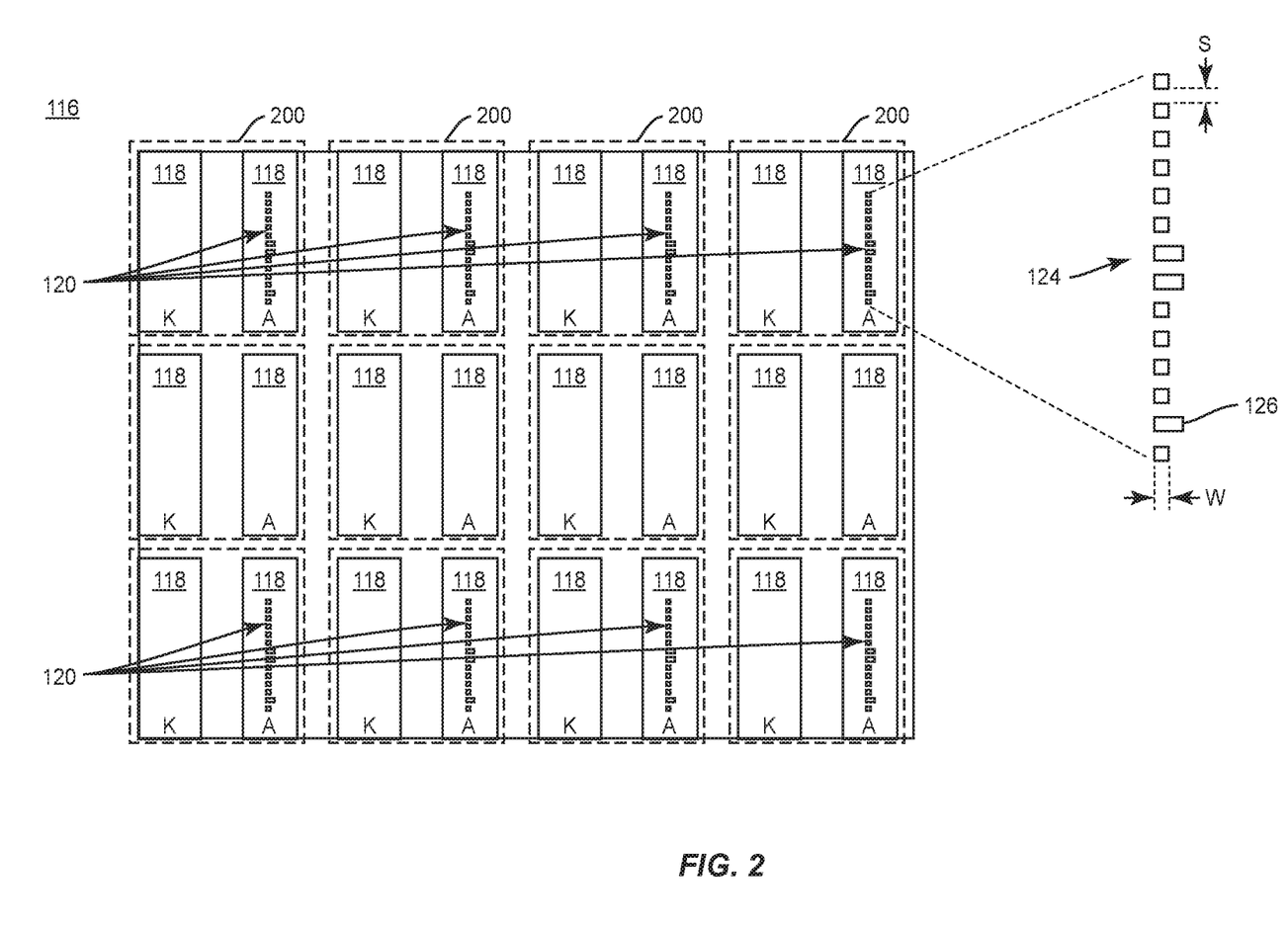
FIG. 2 illustrates a partial plan view of another embodiment of the physically encoded and visually unobstructed structures included in the driver chip.

FIG. 2 illustrates another embodiment of the physically encoded and visually unobstructed structures 120 included in the driver chip 102. The embodiment illustrated in FIG. 2 is similar to the embodiment illustrated in FIG. 1C. Different, however, each group 124 of metal vias 126 having a barcode pattern identifies the location of a group 200 of two adjacent pairs (anode and cathode) of contacts 118 within the array 116 of contacts 118 instead of a single pair of contacts 118 as shown in FIG. 1C. The embodiment in FIG. 2 thus provides 1:2 location mapping for groups of two adjacent pixels 106 included in the array 104 of light emitting or light detecting pixels 106. That is, a group 200 of two adjacent pairs (anode and cathode) of contacts 118 within the array 116 of contacts 118 is assigned the same barcode pattern by the corresponding group 124 of metal vias 126 assigned to that group 200 of two adjacent pairs of contacts 118. The light emitting or light detecting pixels 106 electrically connected to these two pairs of contacts 118 can be safely and quickly located by visual inspection based on the corresponding barcode assigned to the two pairs of contacts 118. In general, the encoding structures 120 included in the driver chip 102 provide 1:n location mapping for the pixels 106 included in the array 104 of light emitting or light detecting pixels 106 where n is a positive whole number greater than or equal to 1, e.g., every pixel 106, every other pixel 106, every 4 pixels 106, every 8 pixels 106, every 16 pixels 106, etc.

Figure 3:
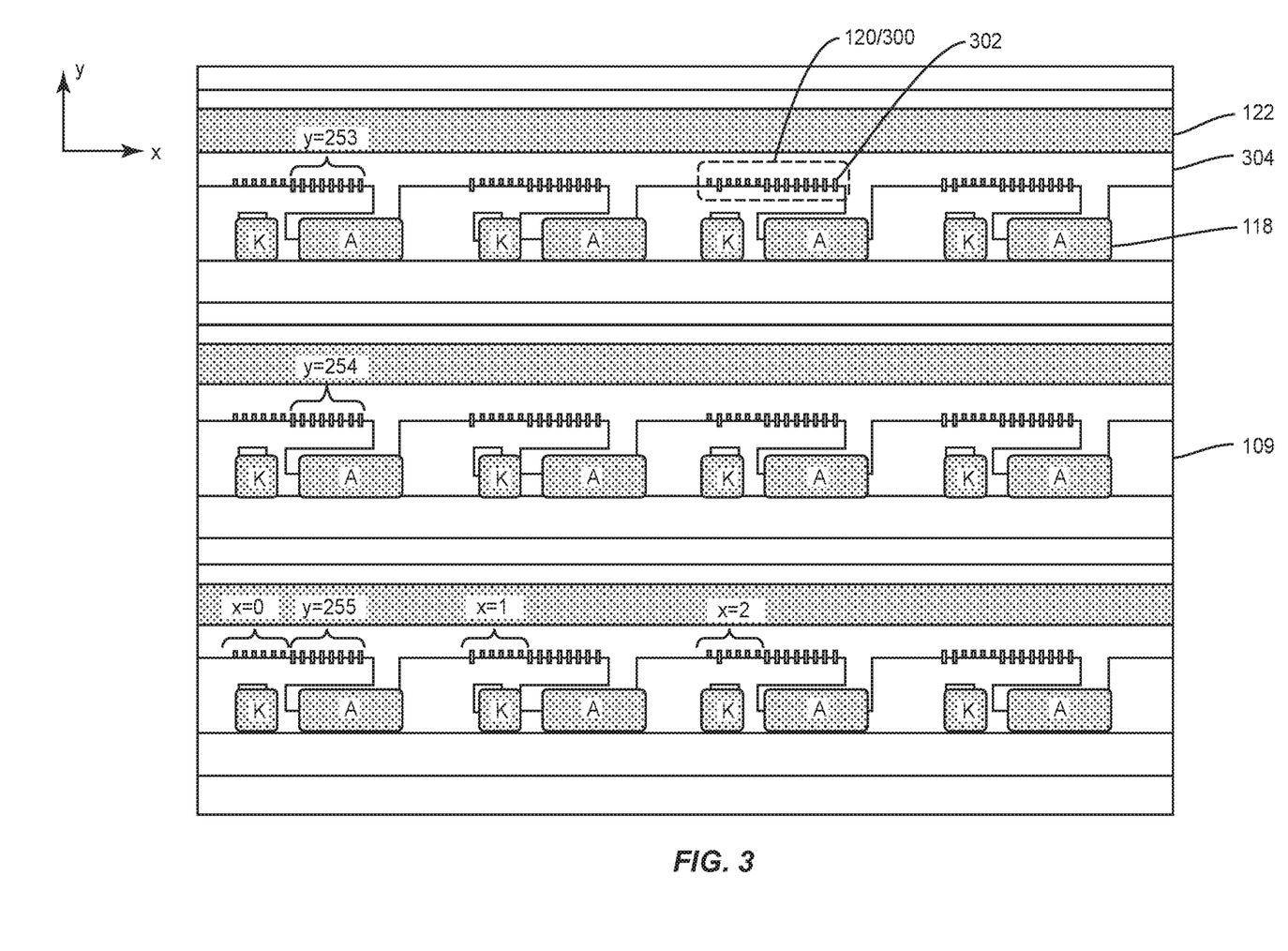
FIG. 3 illustrates a partial plan view of another embodiment of the physically encoded and visually unobstructed structures included in the driver chip.

FIG. 3 illustrates a partial plan view of another embodiment of the physically encoded and visually unobstructed structures 120 included in the driver chip 102. According to this embodiment, each physically encoded and visually unobstructed structure 120 is a group 300 of metal vias 302 dimensioned, e.g., like a barcode, so that the group 300 of metal vias 302 is physically encoded with x-y location information for an individual pair (A and K) of contacts 118 within the array 116 of contacts 118 or a group of adjacent pairs of contacts 118 within the array 116 of contacts 118. The x-y location information allows for safe and quick identification of an individual pixel 106 or a group of adjacent pixels 106 in the array 104 of light emitting or light detecting pixels 106, based on the x and y location information encoded into the group 300 of metal vias 302 associated with the corresponding contacts 118 of the driver chip 102 which are electrically connected to that individual pixel 106 or group of adjacent pixels 106. In general, the x-y location information encoded into the structures 120 included in the driver chip 102 provides 1:n location mapping for the pixels 106 included in the array 104 of light emitting or light detecting pixels 106 where n is a positive whole number greater than or equal to 1, e.g., every pixel 106, every other pixel 106, every 4 pixels 106, every 8 pixels 106, every 16 pixels 106, etc. The physically encoded structures 120 included in the driver chip 102 are visually unobstructed, meaning that neither the last metal layer nor a metal layer 304 below the last metal layer 112 inhibits/blocks visual inspection of the physically encoded structures 120.

Figure 4:
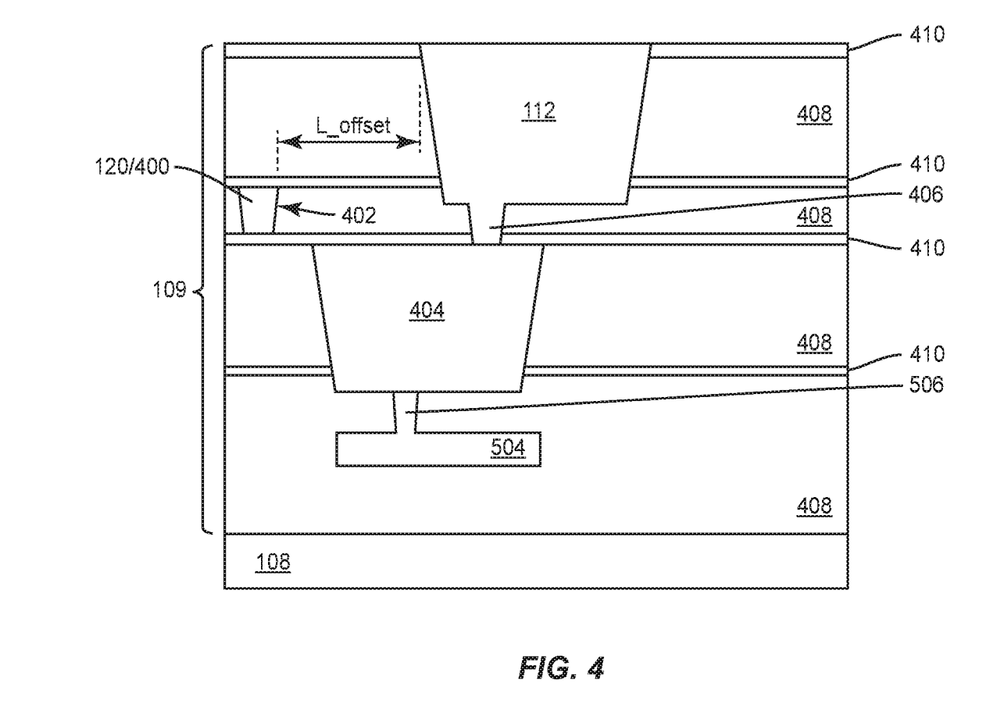
FIG. 4 through 10 illustrate respective partial cross-sectional views of the physically encoded and visually unobstructed structures included in the driver chip, according to further embodiments.

FIG. 4 illustrates a partial cross-sectional view of another embodiment of the physically encoded and visually unobstructed structures 120 included in the driver chip 102. According to this embodiment, each physically encoded and visually unobstructed structure 120 is a group of metal vias 400 formed in a via layer 402. The via layer 402, in this embodiment, vertically connects the last metal layer 112 to an underlying metal layer 404. The via layer 402 includes additional metal vias 406 which electrically connect the last metal layer 112 to the underlying metal layer 404, for enabling the electrical connection between the driver circuitry 110 and the array 116 of contacts 118. The metal layers 112, 404 are separated by an insulating material 109 such as dielectric layers 408 and passivation layers 410.

Each physically encoded and visually unobstructed group of metal vias 400 formed in the via layer 402 is laterally offset (L_offset) from the metal lines of the last metal layer 112 so as to be visually unobstructed by the last metal layer 112 at the side of the last metal layer 112 which faces away from the semiconductor substrate 108. Each physically encoded and visually unobstructed group of metal vias 400 formed in the via layer 402 may be electrically isolated from the array 116 of contacts 118 and from the driver circuitry 110, as previously explained herein.

Figure 5:
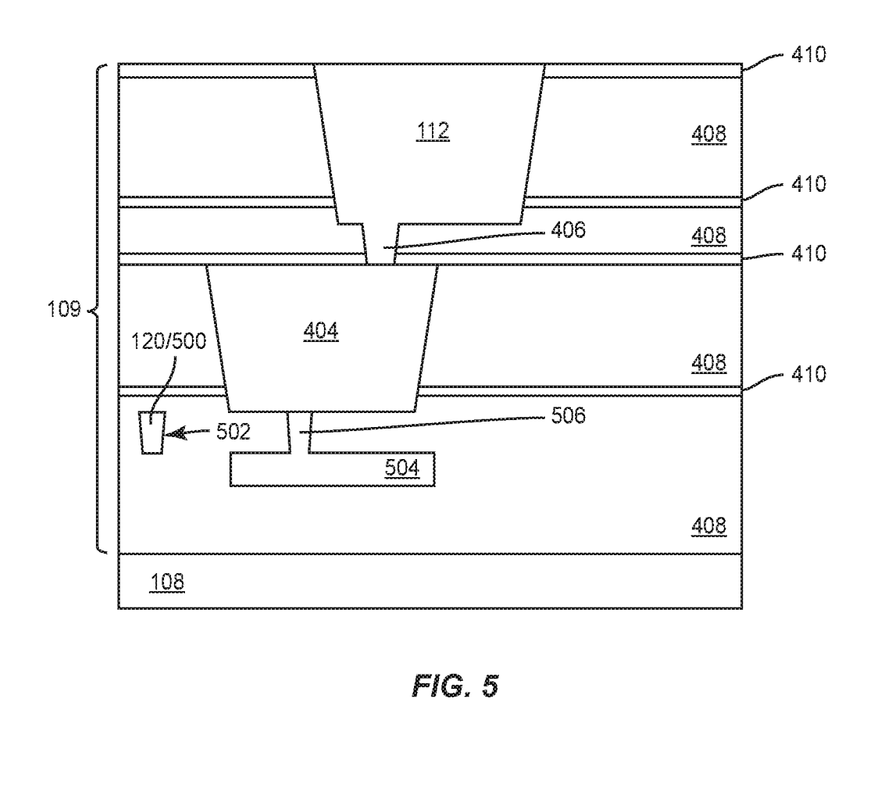

FIG. 5 illustrates a partial cross-sectional view of another embodiment of the physically encoded and visually unobstructed structures 120 included in the driver chip 102. The embodiment shown in FIG. 5 is similar to the embodiment shown in FIG. 4. Different, however, each physically encoded and visually unobstructed structure 120 is a group of metal vias 500 formed in a lower via layer 502 which vertically connects the metal layer 404 below the last metal layer 112 to another underlying metal layer 504. The lower via layer 502 includes additional metal vias 506 which electrically connect the last metal layer 112 to the underlying metal layer 404, for enabling the electrical connection between the driver circuitry 110 and the array 116 of contacts 118. The upper metal layers 112, 404 and corresponding upper via layer 402 may comprise copper and at least the lowermost metal layer 504 and corresponding via layer 502 may also comprise copper or a different electrically conductive material such as aluminium, tungsten, etc.

Figure 6:
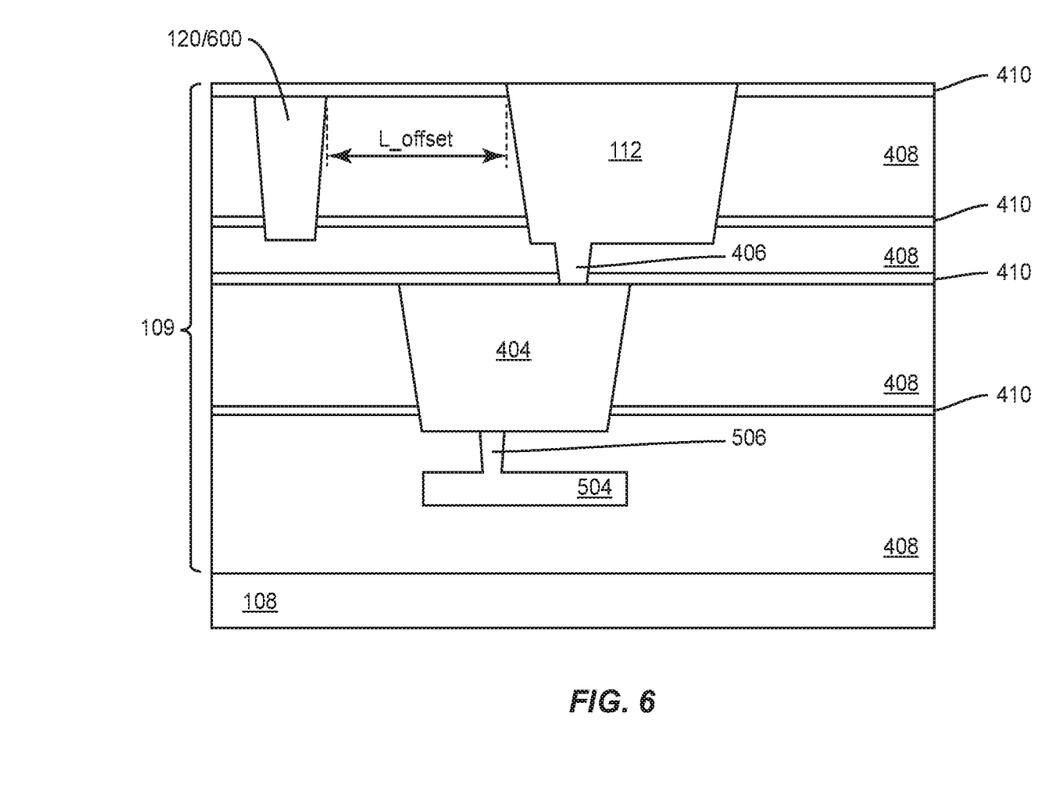

FIG. 6 illustrates a partial cross-sectional view of another embodiment of the physically encoded and visually unobstructed structures 120 included in the driver chip 102. According to this embodiment, the physically encoded and visually unobstructed structures 120 are patterned/encoded metal structures 600 formed in the last metal layer 112. Each patterned/encoded metal structures 600 is laterally offset (L) from other metal lines of the last metal layer 112 so as to be visually unobstructed by the other metal lines of the last metal layer 112 at the side of the last metal layer 112 which faces away from the semiconductor substrate 108. Each patterned/encoded metal structures 600 formed in the last metal layer 112 may be electrically isolated from the array 116 of contacts 118 and from the driver circuitry 110, as previously explained herein.

Figure 7:
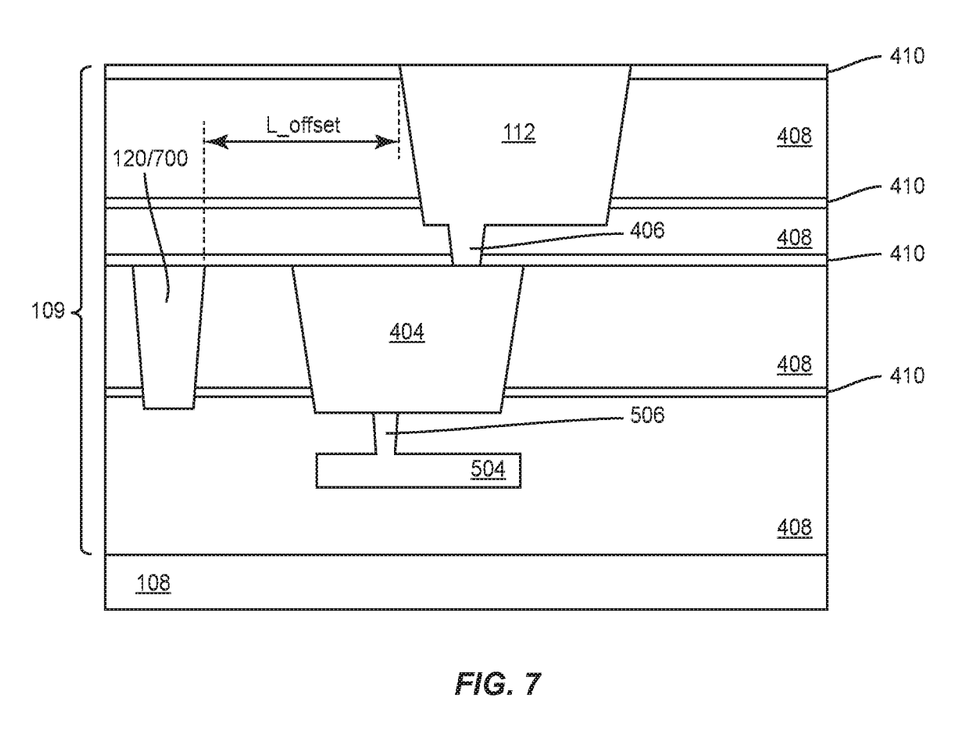

FIG. 7 illustrates a partial cross-sectional view of another embodiment of the physically encoded and visually unobstructed structures 122 included in the driver chip 102. The embodiment shown in FIG. 7 is similar to the embodiment shown in FIG. 6. Different, however, the physically encoded and visually unobstructed structures 122 are patterned/encoded metal structures 700 formed in a metal layer 404 below the last metal layer 112 of the driver chip 102. Each patterned/encoded metal structure 700 formed in the underlying metal layer 404 is laterally offset (L) from the metal lines of the last metal layer 112 so as to be visually unobstructed by the last metal layer 112 at the side of the last metal layer 112 which faces away from the semiconductor substrate 108, and may be electrically isolated from the array 116 of contacts 118 and from the driver circuitry 110 as previously explained herein.

Figure 8:
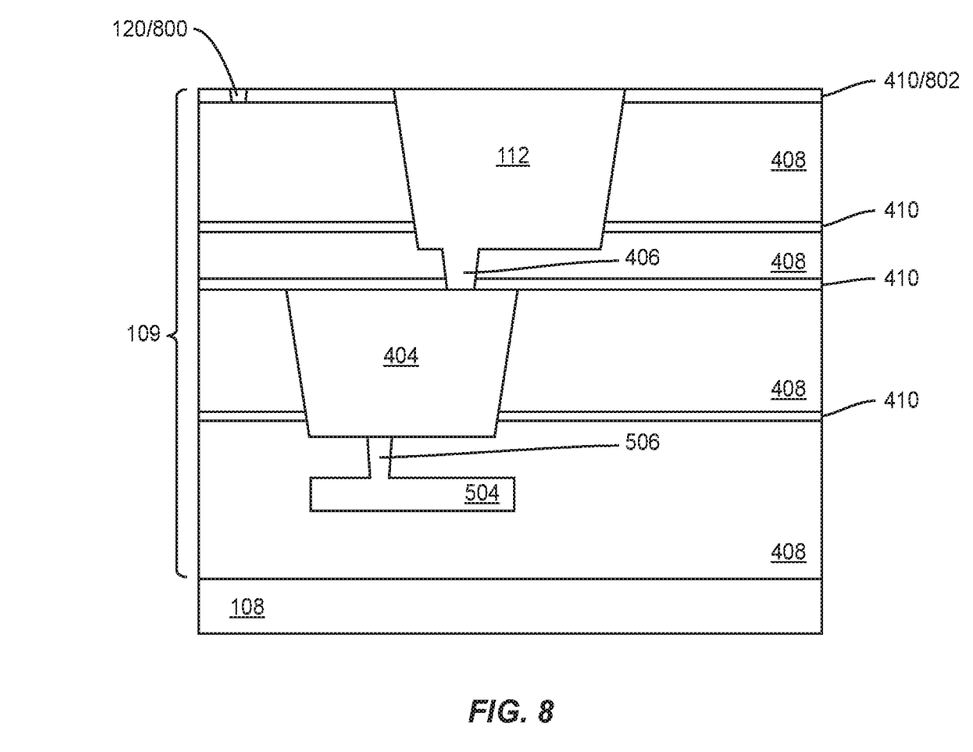

FIG. 8 illustrates a partial cross-sectional view of another embodiment of the physically encoded and visually unobstructed structures 120 included in the driver chip 102. According to this embodiment, the physically encoded and visually unobstructed structures 120 are patterned/encoded regions 800 formed in the uppermost passivation layer 802 on the last metal layer 112. The uppermost passivation layer 802 protects the driver chip 102 from corrosion by the environment during use. The patterned/encoded regions 800 may be formed in the uppermost passivation layer 802 using a typical lithography process, e.g., by etching corresponding patterns into an unmasked part of the passivation layer 802. The etched patterns 800 may be filled with a material that provides sufficient contrast, such as a metal, so that the etched patterns 800 are visually unobstructed by the last metal layer 112 at the side of the last metal layer 112 which faces away from the semiconductor substrate 108.

Figure 9:
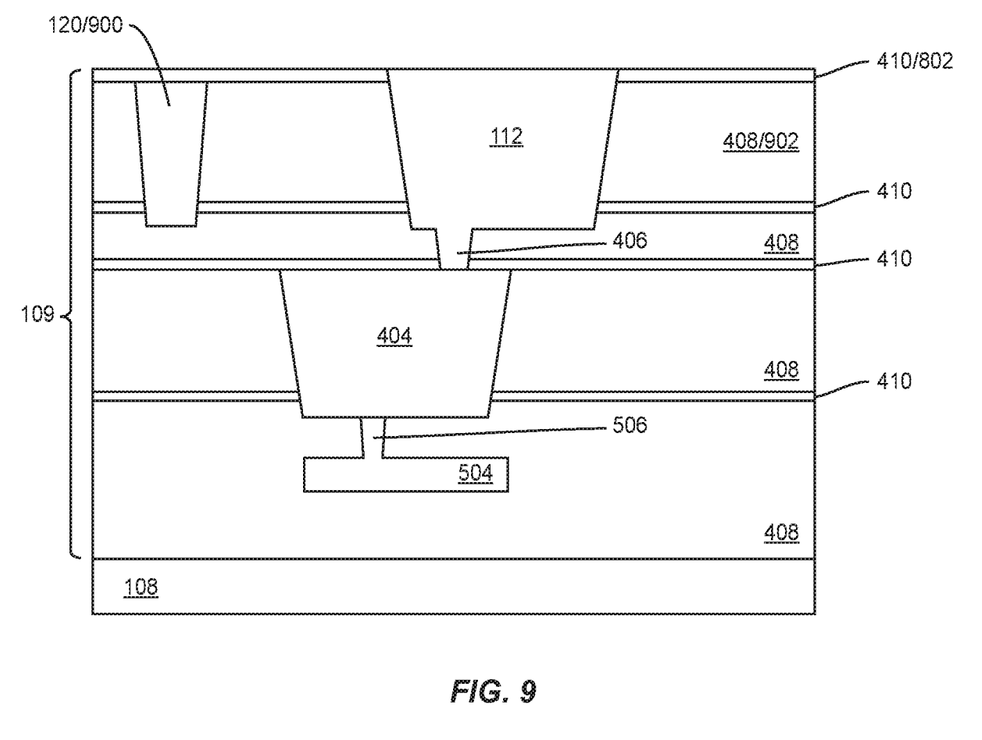

FIG. 9 illustrates a partial cross-sectional view of another embodiment of the physically encoded and visually unobstructed structures 120 included in the driver chip 102. According to this embodiment, the physically encoded and visually unobstructed structures 120 are patterned/encoded regions 900 formed in the uppermost dielectric layer 902 which separates the last metal layer 112 from the underlying metal layer 404. The uppermost dielectric layer 902 may comprise, e.g., silicon oxide, silicon nitride, etc. The patterned/encoded regions 900 may be formed in the uppermost dielectric layer 902 using a typical lithography process, e.g., by etching corresponding patterns into an unmasked part of the dielectric layer. The etched patterns 900 may be filled with a material that provides sufficient contrast, such as a metal, so that the etched patterns 900 are visually unobstructed by the last metal layer 112 at the side of the last metal layer 112 which faces away from the semiconductor substrate 108. The etched patterns 902 may instead be unfilled voids in the uppermost dielectric layer 902.

Figure 10:
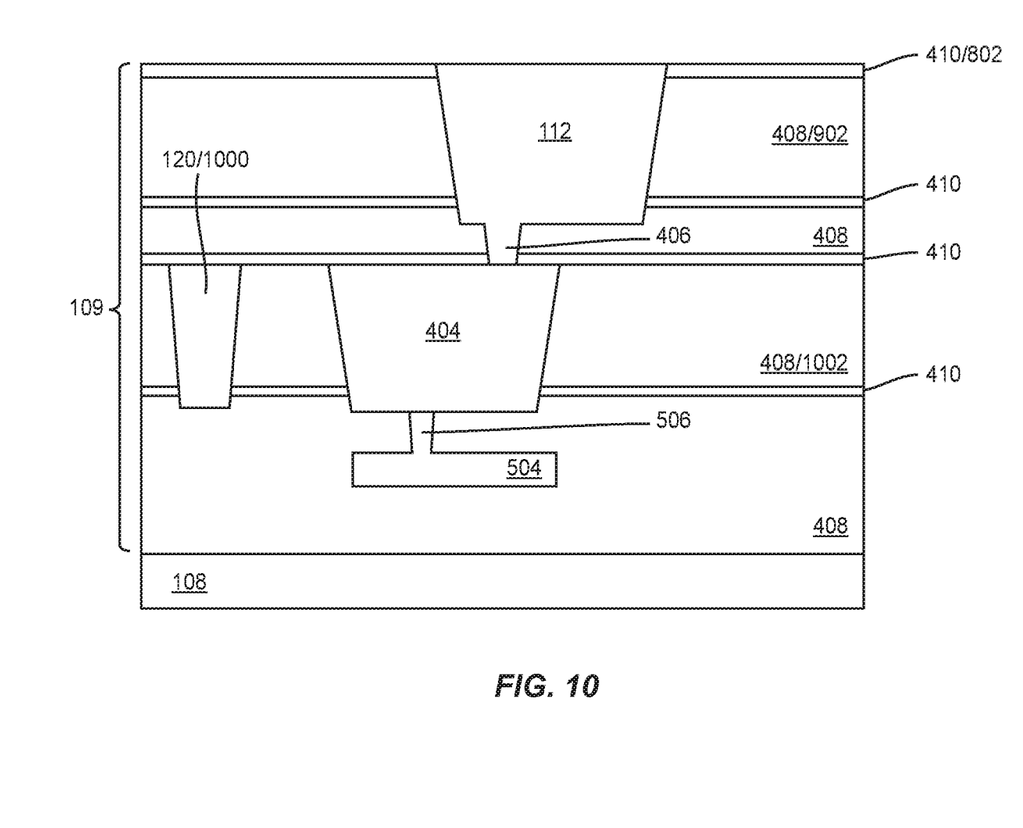

FIG. 10 illustrates a partial cross-sectional view of another embodiment of the physically encoded and visually unobstructed structures 120 included in the driver chip 102. The embodiment shown in FIG. 10 is similar to the embodiment shown in FIG. 9. Different, however, patterned/encoded regions 1000 are formed in a dielectric layer 1002 which separates two metal layers 400, 504 below the last metal layer 112. The dielectric layer 1002 may comprise, e.g., silicon oxide, silicon nitride, etc. The patterned/encoded regions 1000 may be formed in the dielectric layer 1002 using a typical lithography process, as explained above, and the etched patterns 1000 may or may not be filled so as to provide sufficient contrast for visual observation/inspection.

Although the present disclosure is not so limited, the following numbered examples demonstrate one or more aspects of the disclosure.

Example 1. A semiconductor chip, comprising: a semiconductor substrate comprising driver circuitry configured to drive an array of electronic devices; a metal layer above the semiconductor substrate, the metal layer comprising an array of contacts electrically connected to the driver circuitry and configured to provide an electrical connection between the semiconductor chip and the array of electronic devices; and a plurality of structures formed in the metal layer and/or in a layer between the metal layer and the semiconductor substrate, the plurality of structures being visually unobstructed at a side of the metal layer which faces away from the semiconductor substrate, wherein each structure of the plurality of structures is physically encoded with a pattern that corresponds to a location of an individual pair of contacts within the array of contacts or a location of a group of adjacent pairs of contacts within the array of contacts.

Example 2. The semiconductor chip of example 1, wherein each structure of the plurality of structures comprises a group of metal vias, and wherein each via of a group of metal vias is dimensioned so that the group of metal vias is physically encoded with a pattern that corresponds to a location of an individual pair of contacts within the array of contacts or a location of a group of adjacent pairs of contacts within the array of contacts.

Example 3. The semiconductor chip of example 2, wherein each via of a group of metal vias is dimensioned so that the group of metal vias is physically encoded with a barcode pattern the widths and spacings of which correspond to a location of an individual pair of contacts within the array of contacts or a location of a group of adjacent pairs of contacts within the array of contacts.

Example 4. The semiconductor chip of example 2, wherein each via of a group of metal vias is dimensioned so that the group of metal vias is physically encoded with x-y location information for an individual pair of contacts within the array of contacts or a group of adjacent pairs of contacts within the array of contacts.

Example 5. The semiconductor chip of any one of examples 2 through 4, wherein each group of metal vias is electrically isolated from the array of contacts and from the driver circuitry.

Example 6. The semiconductor chip of any one of examples 2 through 5, wherein each group of metal vias is formed in a via layer having additional metal vias which electrically connect the metal layer to an underlying metal layer, and wherein each group of metal vias is laterally offset from metal lines of the metal layer so as to be visually unobstructed by the metal layer at the side of the metal layer which faces away from the semiconductor substrate.

Example 7. The semiconductor chip of any one of examples 1 through 6, wherein the plurality of structures is formed in the metal layer.

Example 8. The semiconductor chip of any one of examples 1 through 6, wherein the plurality of structures is formed in a dielectric layer which separates the metal layer from an underlying metal layer.

Example 9. The semiconductor chip of any one of examples 1 through 6, wherein the plurality of structures is formed in a passivation layer formed on the metal layer.

Example 10. The semiconductor chip of any one of examples 1 through 9, wherein the array of electronic devices is an array of light emitting or light detecting pixels, and wherein each individual pair of contacts within the array of contacts comprises an anode contact and a cathode contact for electrical connection to a corresponding pixel in the array of light emitting or light detecting pixels.

Example 11. The semiconductor chip of any one of examples 1 through 9, wherein the array of electronic devices is an array of memory cells.

Example 12. A method of producing a semiconductor chip, the method comprising: forming, in a semiconductor substrate, driver circuitry configured to drive an array of electronic devices; forming a metal layer above the semiconductor substrate, the metal layer comprising an array of contacts electrically connected to the driver circuitry and configured to provide an electrical connection between the semiconductor chip and the array of electronic devices; forming a plurality of structures in the metal layer and/or in a layer between the metal layer and the semiconductor substrate, the plurality of structures being visually unobstructed at a side of the metal layer which faces away from the semiconductor substrate; and physically encoding each structure of the plurality of structures with a pattern that corresponds to a location of an individual pair of contacts within the array of contacts or a location of a group of adjacent pairs of contacts within the array of contacts.

Example 13. The method of example 12, wherein forming the plurality of structures comprises forming groups of metal vias in a via layer below the metal layer, and wherein physically encoding each structure of the plurality of structures with a pattern comprises dimensioning the metal vias of each group of metal vias so that each group of metal vias is physically encoded with a pattern that corresponds to a location of an individual pair of contacts within the array of contacts or a location of a group of adjacent pairs of contacts within the array of contacts.

Example 14. The method of example 13, wherein dimensioning the vias of each group of metal vias so that each group of metal vias is physically encoded with a pattern comprises dimensioning the metal vias of each group of metal vias so that each group of metal vias is physically encoded with a barcode pattern the widths and spacings of which correspond to a location of an individual pair of contacts within the array of contacts or a location of a group of adjacent pairs of contacts within the array of contacts.

Example 15. The method of example 13, wherein dimensioning the vias of each group of metal vias so that each group of metal vias is physically encoded with a pattern comprises dimensioning the metal vias of each group of metal vias so that each group of metal vias is physically encoded with x-y location information for an individual pair of contacts within the array of contacts or a group of adjacent pairs of contacts within the array of contacts.

Example 16. The method of any one of examples 13 through 15, further comprising electrically isolating the metal vias of each group of metal vias from the metal layer and the driver circuitry.

Example 17. The method of any one of examples 13 through 16, further comprising: electrically connecting additional metal vias between the metal layer and an underlying metal layer; and laterally offsetting the groups of metal vias from metal lines of the metal layer so that the groups of metal vias are visually unobstructed by the metal layer at the side of the metal layer which faces away from the semiconductor substrate.

Example 18. The method of any one of examples 12 through 17, wherein forming the plurality of structures comprises forming the plurality of structures in the metal layer.

Example 19. The method of any one of examples 12 through 17, wherein forming the plurality of structures comprises forming the plurality of structures in a dielectric layer which separates the metal layer from an underlying metal layer.

Example 20. The method of any one of examples 12 through 17, wherein forming the plurality of structures comprises forming the plurality of structures in a passivation layer formed on the metal layer.

Example 21. The method of any one of examples 12 through 20, wherein the array of electronic devices is an array of light emitting or light detecting pixels, and wherein each individual pair of contacts within the array of contacts comprises an anode contact and a cathode contact for electrical connection to a corresponding pixel in the array of light emitting or light detecting pixels.

Example 22. The method of any one of examples 12 through 20, wherein the array of electronic devices is an array of memory cells.

Example 23. A pixelated light engine, comprising: a driver chip and an array of light emitting pixels on the driver chip, wherein the drive chip comprises: a semiconductor substrate comprising driver circuitry configured to drive the array of light emitting pixels; a metal layer above the semiconductor substrate, the metal layer comprising an array of contacts electrically connected to the driver circuitry and which provides an electrical connection between the semiconductor chip and the array of light emitting pixels; and a plurality of structures formed in the metal layer and/or in a layer between the metal layer and the semiconductor substrate, the plurality of structures being visually unobstructed at a side of the metal layer which faces away from the semiconductor substrate, wherein each structure of the plurality of structures is physically encoded with a pattern that corresponds to a location of an individual pair of contacts within the array of contacts or a location of a group of adjacent pairs of contacts within the array of contacts.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip, comprising:
   a semiconductor substrate comprising driver circuitry configured to drive an array of electronic devices;
   a metal layer above the semiconductor substrate, the metal layer comprising an array of contacts electrically connected to the driver circuitry and configured to provide an electrical connection between the semiconductor chip and the array of electronic devices; and
   a plurality of structures formed in the metal layer and/or in a layer between the metal layer and the semiconductor substrate, the plurality of structures being visually unobstructed at a side of the metal layer which faces away from the semiconductor substrate,
   wherein each structure of the plurality of structures is physically encoded with a pattern that corresponds to a location of an individual pair of contacts within the array of contacts or a location of a group of adjacent pairs of contacts within the array of contacts.

2. The semiconductor chip of claim 1, wherein each structure of the plurality of structures comprises a group of metal vias, and wherein each via of a group of metal vias is dimensioned so that the group of metal vias is physically encoded with a pattern that corresponds to a location of an individual pair of contacts within the array of contacts or a location of a group of adjacent pairs of contacts within the array of contacts.

3. The semiconductor chip of claim 2, wherein each via of a group of metal vias is dimensioned so that the group of metal vias is physically encoded with a barcode pattern the widths and spacings of which correspond to a location of an individual pair of contacts within the array of contacts or a location of a group of adjacent pairs of contacts within the array of contacts.

4. The semiconductor chip of claim 2, wherein each via of a group of metal vias is dimensioned so that the group of metal vias is physically encoded with x-y location information for an individual pair of contacts within the array of contacts or a group of adjacent pairs of contacts within the array of contacts.

5. The semiconductor chip of claim 2, wherein each group of metal vias is electrically isolated from the array of contacts and from the driver circuitry.

6. The semiconductor chip of claim 2, wherein each group of metal vias is formed in a via layer having additional metal vias which electrically connect the metal layer to an underlying metal layer, and wherein each group of metal vias is laterally offset from metal lines of the metal layer so as to be visually unobstructed by the metal layer at the side of the metal layer which faces away from the semiconductor substrate.

7. The semiconductor chip of claim 1, wherein the plurality of structures is formed in the metal layer.

8. The semiconductor chip of claim 1, wherein the plurality of structures is formed in a dielectric layer which separates the metal layer from an underlying metal layer.

9. The semiconductor chip of claim 1, wherein the plurality of structures is formed in a passivation layer formed on the metal layer.

10. The semiconductor chip of claim 1, wherein the array of electronic devices is an array of light emitting or light detecting pixels, and wherein each individual pair of contacts within the array of contacts comprises an anode contact and a cathode contact for electrical connection to a corresponding pixel in the array of light or light detecting emitting pixels.

11. A method of producing a semiconductor chip, the method comprising:
forming, in a semiconductor substrate, driver circuitry configured to drive an array of electronic devices;
forming a metal layer above the semiconductor substrate, the metal layer comprising an array of contacts electrically connected to the driver circuitry and configured to provide an electrical connection between the semiconductor chip and the array of electronic devices;
forming a plurality of structures in the metal layer and/or in a layer between the metal layer and the semiconductor substrate, the plurality of structures being visually unobstructed at a side of the metal layer which faces away from the semiconductor substrate; and
physically encoding each structure of the plurality of structures with a pattern that corresponds to a location of an individual pair of contacts within the array of contacts or a location of a group of adjacent pairs of contacts within the array of contacts.

12. The method of claim 11, wherein forming the plurality of structures comprises forming groups of metal vias in a via layer below the metal layer, and wherein physically encoding each structure of the plurality of structures with a pattern comprises dimensioning the metal vias of each group of metal vias so that each group of metal vias is physically encoded with a pattern that corresponds to a location of an individual pair of contacts within the array of contacts or a location of a group of adjacent pairs of contacts within the array of contacts.

13. The method of claim 12, wherein dimensioning the vias of each group of metal vias so that each group of metal vias is physically encoded with a pattern comprises dimensioning the metal vias of each group of metal vias so that each group of metal vias is physically encoded with a barcode pattern the widths and spacings of which correspond to a location of an individual pair of contacts within the array of contacts or a location of a group of adjacent pairs of contacts within the array of contacts.

14. The method of claim 12, wherein dimensioning the vias of each group of metal vias so that each group of metal vias is physically encoded with a pattern comprises dimensioning the metal vias of each group of metal vias so that each group of metal vias is physically encoded with x-y location information for an individual pair of contacts within the array of contacts or a group of adjacent pairs of contacts within the array of contacts.

15. The method of claim 12, further comprising electrically isolating the metal vias of each group of metal vias from the metal layer and the driver circuitry.

16. The method of claim 12, further comprising:
electrically connecting additional metal vias between the metal layer and an underlying metal layer; and
laterally offsetting the groups of metal vias from metal lines of the metal layer so that the groups of metal vias are visually unobstructed by the metal layer at the side of the metal layer which faces away from the semiconductor substrate.

17. The method of claim 11, wherein forming the plurality of structures comprises forming the plurality of structures in the metal layer.

18. The method of claim 11, wherein forming the plurality of structures comprises forming the plurality of structures in a dielectric layer which separates the metal layer from an underlying metal layer.

19. The method of claim 11, wherein forming the plurality of structures comprises forming the plurality of structures in a passivation layer formed on the metal layer.

20. A pixelated light engine, comprising:
a driver chip; and
an array of light emitting pixels on the driver chip,
wherein the drive chip comprises:
a semiconductor substrate comprising driver circuitry configured to drive the array of light emitting pixels;
a metal layer above the semiconductor substrate, the metal layer comprising an array of contacts electrically connected to the driver circuitry and which provides an electrical connection between the semiconductor chip and the array of light emitting pixels; and
a plurality of structures formed in the metal layer and/or in a layer between the metal layer and the semiconductor substrate, the plurality of structures being visually unobstructed at a side of the metal layer which faces away from the semiconductor substrate,
wherein each structure of the plurality of structures is physically encoded with a pattern that corresponds to a location of an individual pair of contacts within the array of contacts or a location of a group of adjacent pairs of contacts within the array of contacts.

* * * * *